United States Patent
Hashimoto et al.

(10) Patent No.: US 6,954,031 B2
(45) Date of Patent: Oct. 11, 2005

(54) LIGHT-EMITTING DISPLAY DEVICE WITH SUBSTRATE HAVING SURFACE IRREGULARITIES

(75) Inventors: Yasunobu Hashimoto, Akashi (JP); Yoshiho Seo, Akashi (JP); Naoki Itokawa, Akashi (JP); Motonari Kifune, Higashimorokata-gun (JP); Yasushi Ohkawa, Akashi (JP)

(73) Assignee: Fujitsu Limited, Kawasaki (JP)

( * ) Notice: Subject to any disclaimer, the term of this patent is extended or adjusted under 35 U.S.C. 154(b) by 55 days.

(21) Appl. No.: 10/606,744

(22) Filed: Jun. 27, 2003

(65) Prior Publication Data

US 2004/0017152 A1 Jan. 29, 2004

(30) Foreign Application Priority Data

Jul. 24, 2002 (JP) ........................................ 2002-215371
Jun. 9, 2003 (JP) ........................................ 2003-164010

(51) Int. Cl.$^7$ .................... H05B 33/00; H05B 33/02; H05B 33/08
(52) U.S. Cl. .................... 313/503; 313/500; 313/505; 313/506; 313/292
(58) Field of Search .................. 313/500, 503, 313/506, 292

(56) References Cited

U.S. PATENT DOCUMENTS 4,774,435 A * 9/1988 Levinson .................... 313/509

FOREIGN PATENT DOCUMENTS

| EP | 969699 A1 | * | 1/2000 | ........... H05B/33/02 |
| JP | 61156691 A | * | 7/1986 | ........... H05B/33/02 |
| JP | 01105987 A | * | 4/1989 | ............. G09F/9/00 |

* cited by examiner

*Primary Examiner*—Mariceli Santiago
(74) *Attorney, Agent, or Firm*—Staas & Halsey LLP

(57) ABSTRACT

A light-emitting display device includes a substrate and light-emitting layers constituting pixels on a surface of the substrate in which light emission is electrically controlled for every pixel. The light-emitting display device further includes barriers delimiting at least one side of each pixel. On the surface of the substrate, at least part of a region that corresponds to each pixel has irregularities for light scattering. The difference between the maximum height and the minimum height of the irregularities is at least 0.4 μm. The barriers and the irregularities are formed by sandblasting the surface of the substrate. The irregularities reduce attenuation of light by total reflection in the interior of the substrate and improve brightness of the device.

10 Claims, 13 Drawing Sheets

PRIOR ART

PRIOR ART

PRIOR ART

US 6,954,031 B2

LIGHT-EMITTING DISPLAY DEVICE WITH SUBSTRATE HAVING SURFACE IRREGULARITIES

BACKGROUND OF THE INVENTION

1. Field of the Invention

The present invention relates to light-emitting display devices such as electroluminescent devices and particularly relates to a light-emitting display device having barriers that delimit a display region.

2. Description of the Related Art

Application of flat panel display devices such as liquid crystal devices and electroluminescent (EL) devices is expanding with spread of portable terminals and the like.

EL devices and particularly organic EL devices of a self-luminous type can be driven at a relatively low voltage and can display colors. Such devices are now applied to display devices of mobile phones in practice. Large-sized EL devices are currently under development and are expected to have various applications as displays for personal computers and television sets.

FIG. 1 is a cross-sectional view of a typical organic EL device. The organic EL device has a substrate 1 of glass or the like, an anode 2 of a transparent material such as indium tin oxide (ITO), a hole transport layer 3, an EL layer 4, and a triple-layer cathode 5 of lithium fluoride, calcium, and aluminum. The organic EL device is driven by a direct current. When a DC current is applied between the anode 2 and the cathode 5, holes are injected from the hole transport layer 3 into the EL layer 4 and are combined with electrons injected from the cathode 5 to excite a host material contained in the EL layer 4 or the emission center. As a result, the EL device emits light.

In general, moisture deteriorates materials for the EL layer 4. Thus, wet patterning processes such as etching are not suitable for the formation of the EL layer 4 and overlying layers. Thus, the EL layer 4 and the cathode 5 are generally formed by printing or mask deposition. Incidentally, a color display requires a plurality of light-emitting layers. When these light-emitting layers are formed by printing or mask deposition, a color region readily bleeds toward adjoining color regions during the formation of the color region, resulting in undesirable color mixing. For example, in a full-color display device having picture units, each picture unit including a red pixel 4R, a green pixel 4G, and a blue pixel 4B, as shown in FIG. 2, barriers 6 are formed between these pixels 4R, 4G, and 4B to prevent bleeding of each color material. In the present invention, a minimum unit for controlling emission of the EL layers is referred to as "pixel," whereas a minimum combination of different colors is referred to as "picture unit." That is, one picture unit includes three R, G, and B pixels for a three-primary color display or one pixel for a monochrome display. This organic EL device including the barriers 6 is formed by steps shown in FIGS. 3A to 3D. Referring to FIG. 3A, ITO is deposited on a glass substrate 1 and is etched into a predetermined pattern to form an anode 2. Referring to FIG. 3B, a resin material 7 such as a photoresist is applied onto the entire surface of the substrate 1 with the anode 2. The resin material 7 is dried, is exposed with a mask, is developed, and is fired to form barriers 6 as shown in FIG. 3C. Referring to FIG. 3D, hole transport layers 3, EL layers 4, and cathodes 5 are formed between the barriers 6 on the anode 2 by mask deposition or the like. In FIG. 3D, a hole transport layer 3, an EL layer 4, and a cathode 5 are referred to as an "EL structure 8."

For improving the brightness and efficiency of display, the relationship on the refractive indices between the substrate and air is important. As shown by an optical path b in FIG. 4, when light is incident on the substrate 1 from the EL structure 8 at an angle exceeding a critical angle that is determined by the ratio of the refractive index of the air to that of the substrate, the light is completely reflected at a surface (at a viewer side) in contact with the air. In another optical path c, light is repeatedly reflected in the EL structure 8. Thus, the emergence efficiency of the light from the device to the exterior is at most 15% to 20%.

For solving this problem, a structure shown in FIG. 5 is disclosed in U.S. Pat. No. 4,774,435. A surface, in contact with an EL structure, of a substrate 1 has irregularities 9 with a roughness that is larger than the wavelength of light to cause light scattering on the irregular surface that improves the emergence efficiency. These surface irregularities are formed by etching the substrate surface. An anode, a hole transport layer, an EL layer, and a cathode are formed on the irregular surface in that order.

Unfortunately, a combination of the barriers 6 shown in FIG. 2 and the irregularities 9 shown in U.S. Pat. No. 4,774,435 requires two processing steps, i.e., the formation of the irregularities 9 and the formation of the barriers 6, resulting in increased process cost.

In order to improve the brightness of each pixel of the EL device and to control the pixel precisely, the EL device is preferably of an active matrix type having a switching element such as a thin film transistor (TFT) for every pixel. For providing switching elements having uniform characteristics, the underlying surface on with the switching elements are formed must be flat. Thus, a mask of a resist or the like must be formed before etching to keep flat regions on the surface, resulting in increased process cost.

SUMMARY OF THE INVENTION

An object of the present invention is to provide a light-emitting display device having barriers, irregularities that cause light scattering, and flat regions for forming switching elements.

Another object of the present invention is to provide a method for making the light-emitting display device that can produces barriers and irregularities by reduced manufacturing steps.

A light-emitting display device according to a first aspect of the present invention includes a substrate; light-emitting layers constituting pixels on a surface of the substrate, light emission from the pixel being electrically controlled; barriers delimiting at least one side of each pixel respectively. On the surface of the substrate, at least part of a region that corresponds to each pixel has irregularities for light scattering. The difference between the maximum height and the minimum height of the irregularities is at least 0.4 µm. The barriers and the irregularities are formed by chipping the surface of the substrate.

Preferably, the light-emitting display device further includes switching elements on the tops of the barriers. Each switching element is provided for each pixel to control the light-emission from the light-emitting layer in the pixel.

According to a second aspect of the present invention, a method for making a light-emitting display device includes the steps of: forming a mask pattern on a surface of a substrate, the mask pattern corresponding to the pattern of barriers to be formed; spraying first sandblasting particles onto the surface of the substrate to chip off the exposed regions not covered by the mask pattern for forming grooves with a depth corresponding to the height of the barriers; and spraying second sandblasting particles smaller than the first sandblasting particles to form irregularities for light scattering on the side walls and bottoms of the grooves, the difference between the maximum height and the minimum height of the irregularities being at least 0.4 µm.

This sandblasting method enables simultaneous formation of the barriers and irregularities for light scattering at an optimized condition.

Furthermore, the switching elements formed on the flat tops of the barriers have uniform characteristics in the display device.

The light-emitting display device of the present invention exhibits distinct color separation between different colors without blur and exhibits high brightness. Furthermore, switching elements for an active matrix can be readily formed on the substrate of the light-emitting display device.

DESCRIPTION OF THE PREFERRED EMBODIMENTS

First Embodiment

Figure 1:
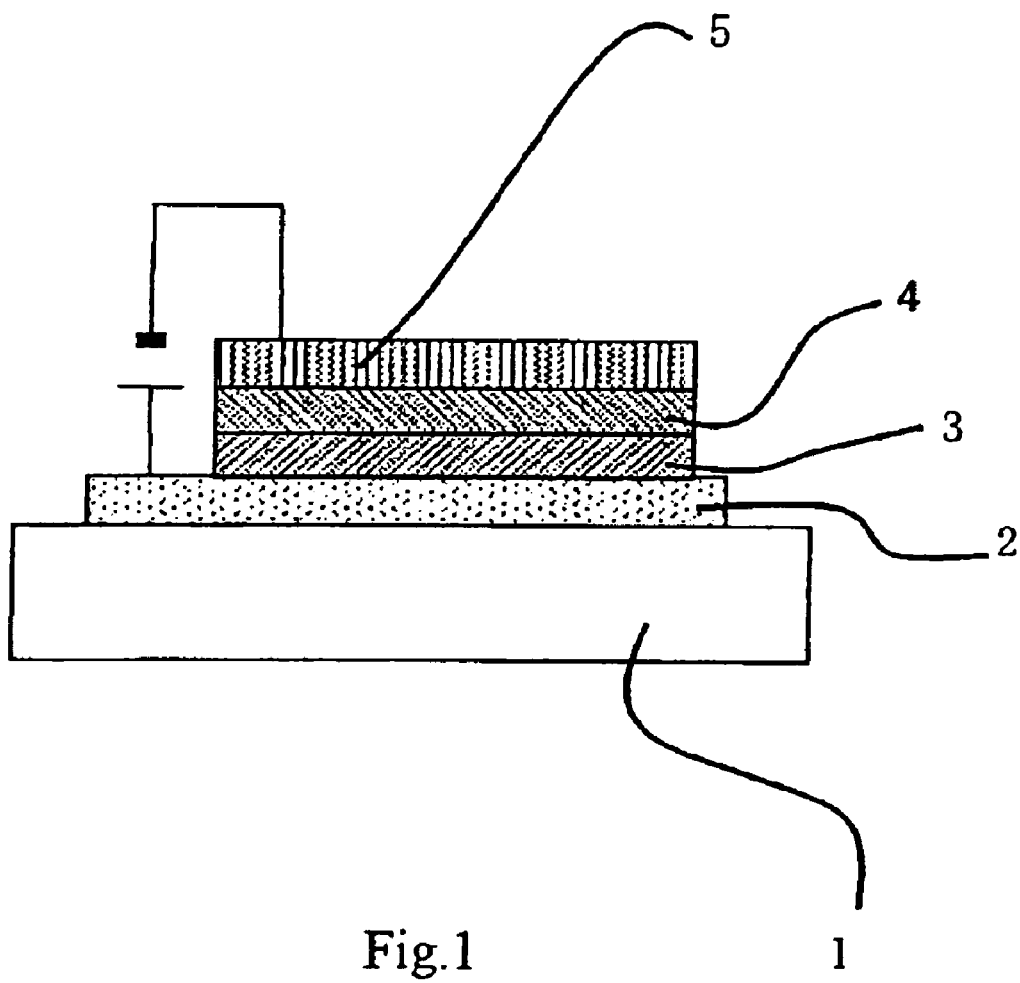
FIG. 1 is a cross-sectional view of an organic EL device.
Figure 2:
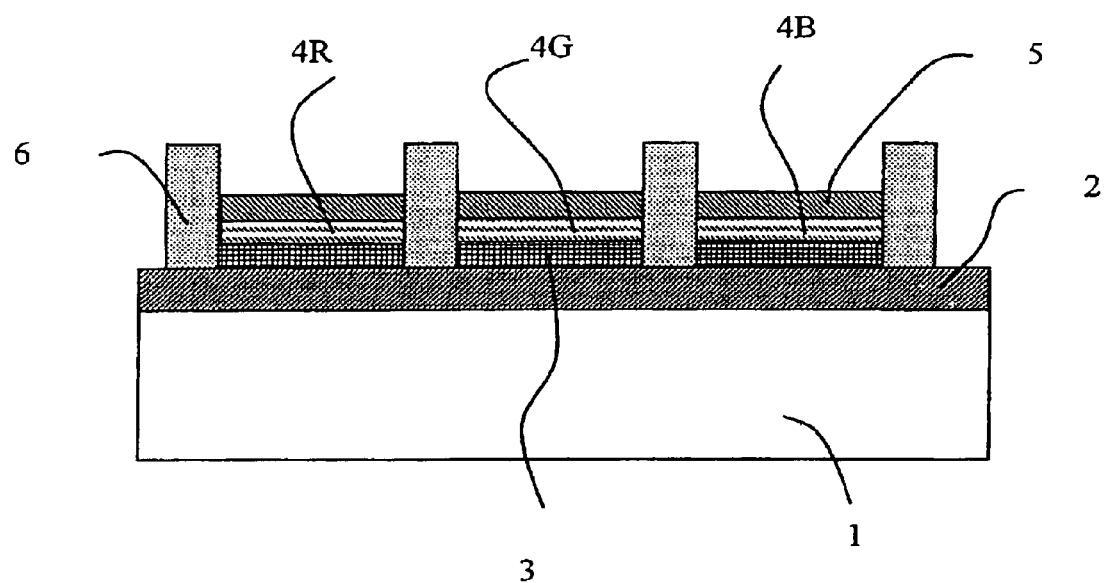
FIG. 2 is a cross-sectional view of an EL device including three color layers divided by barriers.
Figure 3A:
FIGS. 3A to 3D are cross-sectional views of steps for forming an EL device having barriers.
Figure 3B:
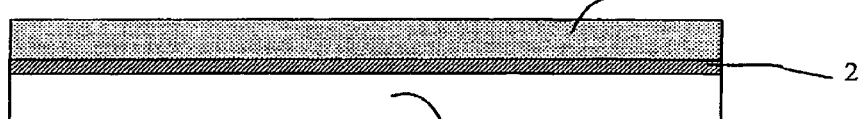
Figure 3C:
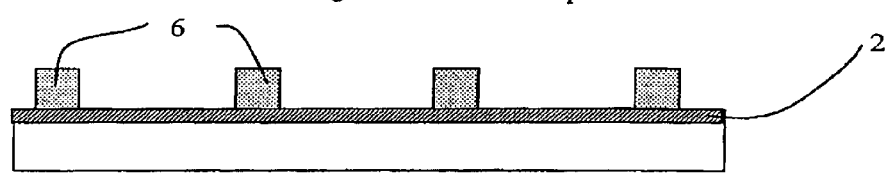
Figure 3D:
Figure 4:
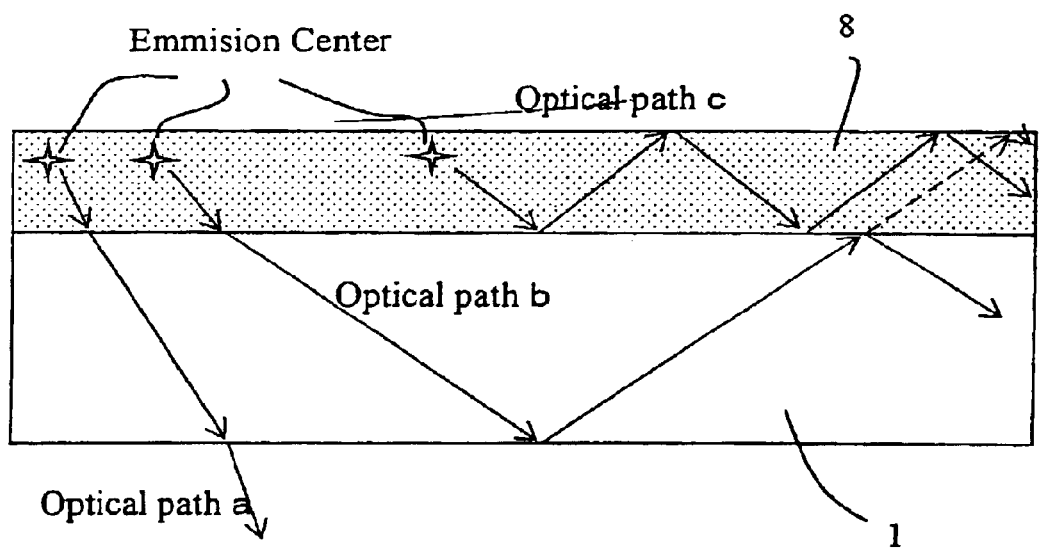
FIG. 4 is a cross-sectional view illustrating light transmittance loss due to internal reflection.
Figure 5:
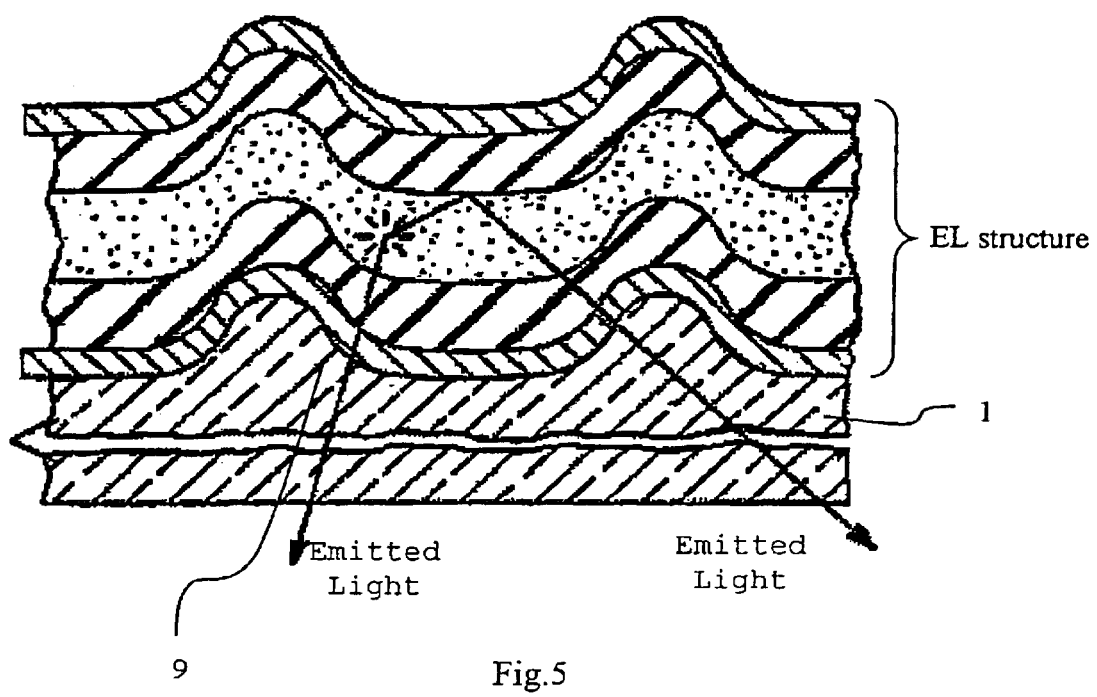
FIG. 5 is a cross-sectional view illustrating a known method for reducing light transmittance loss due to internal reflection.
Figures 6A, 6B:
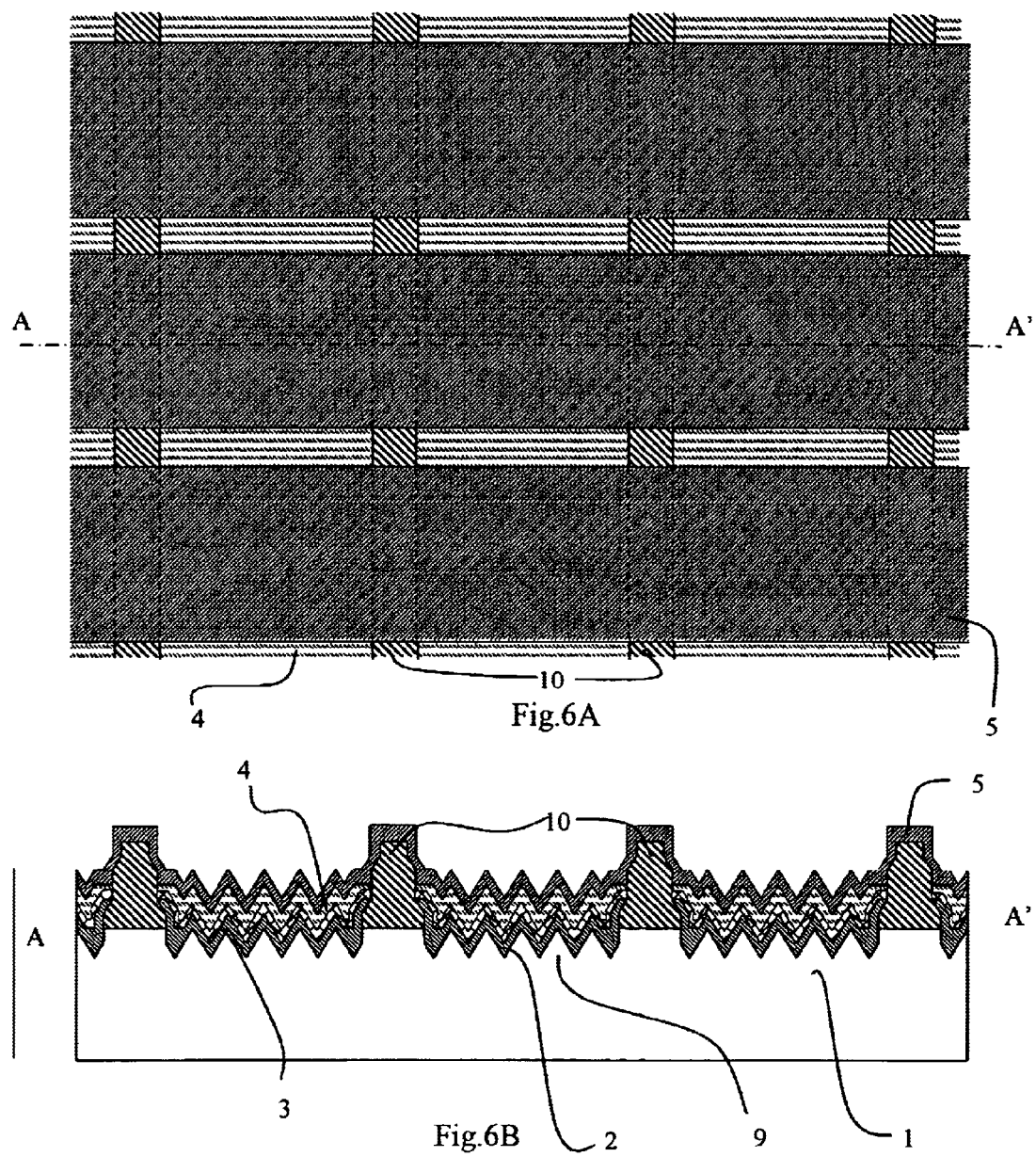
FIGS. 6A and 6B are a schematic plan and a cross-sectional views, respectively, of an EL display device according to a first embodiment of the present invention.

FIG. 6A is a schematic plan view of an EL display device according to a first embodiment of the present invention. FIG. 6B is a cross-sectional view along A–A' indicated in FIG. 6A. Irregularities 9 for light scattering and barriers 10 are formed for pixel regions by direct chipping of a surface of a substrate 1. Throughout the drawings in the present invention, the barriers 10 are parts of the substrate 1 although they are represented roughly by hatching. Thus, no boundary is actually present between the substrate 1 and the barriers 10.

With reference to FIGS. 7A to 7D, the method for making the EL display device will now be described.

Figure 7A:
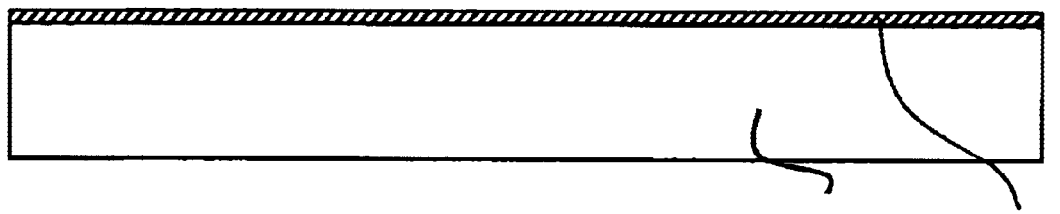
FIGS. 7A to 7D are schematic cross-sectional views showing steps of forming the EL display device according to the first embodiment.
Figure 7B:
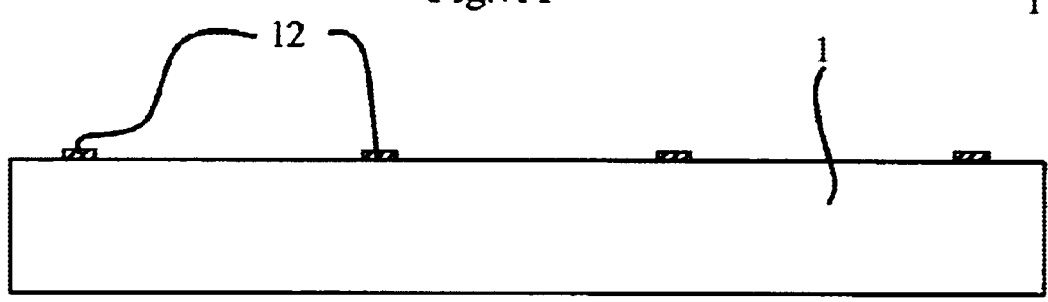
Figure 7C:
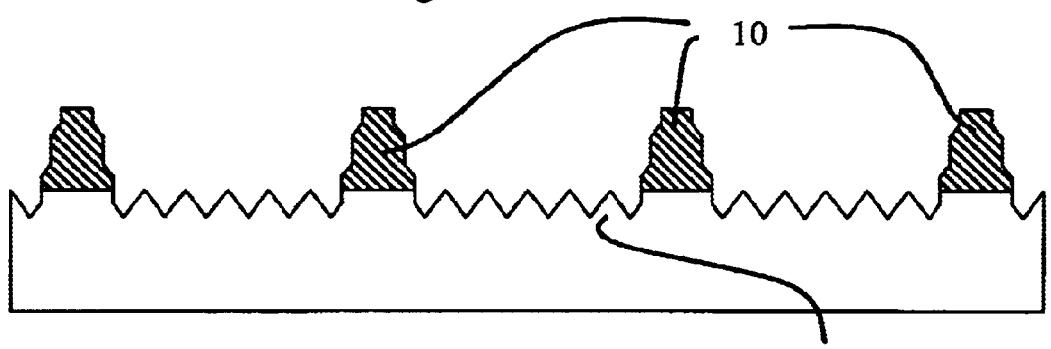

Referring to FIG. 7A, a dry film 11 with a thickness of 40 µm is bonded onto the entire surface of a glass substrate 1. The dry film 11 functions as a mask during sandblasting. The dry film 11 is exposed with a photomask having a striped pattern with a pitch of 300 µm and a width of 100 µm, which correspond to the pattern of the barriers, and is developed to form dry filmstrips 12 at positions for forming the barriers as shown in FIG. 7B. Referring to FIG. 7C, sandblasting is repeated two times by using abrasive particles such as alumina particles that have different sizes between the first blasting and the second blasting to chip off the surface of the substrate 1 other than portions below the dry filmstrips 12. The dry filmstrips 12 are removed. Thereby, barriers 10 and irregularities 9 for light scattering are simultaneously formed on the substrate 1. The irregularities 9 between the barriers 10 correspond to regions for forming pixels. In order to minimize the internal attenuation of light in the substrate, the roughness (the difference between the maximum height and the minimum height of the irregularities) of the irregularities 9 must be larger than the wavelength of the light. Thus, the roughness is at least 0.4 µm and preferably at least 1 µm. In order to form such a roughness, the uncovered portions of the substrate 1 are chipped off with first abrasive particles (alumina particles) having an average diameter of about 20 µm to form grooves with an average depth of about 10 µm that corresponds to the height of the barriers 10, and the bottoms and sides of the grooves are chipped off with second abrasive particles having an average particle diameter of about 10 µm to control the roughness of the irregularities 9 between the barriers 10. The average roughness of the irregularities 9 is controlled to the range of 1.0 to 1.5 µm. The sides of each barrier 10 are gently tapered to prevent disconnection of a cathode 5 on the sides and the top of each barrier 10. The shape of the taper can be determined by controlling the size of the sandblasting particles.

Figure 7D:
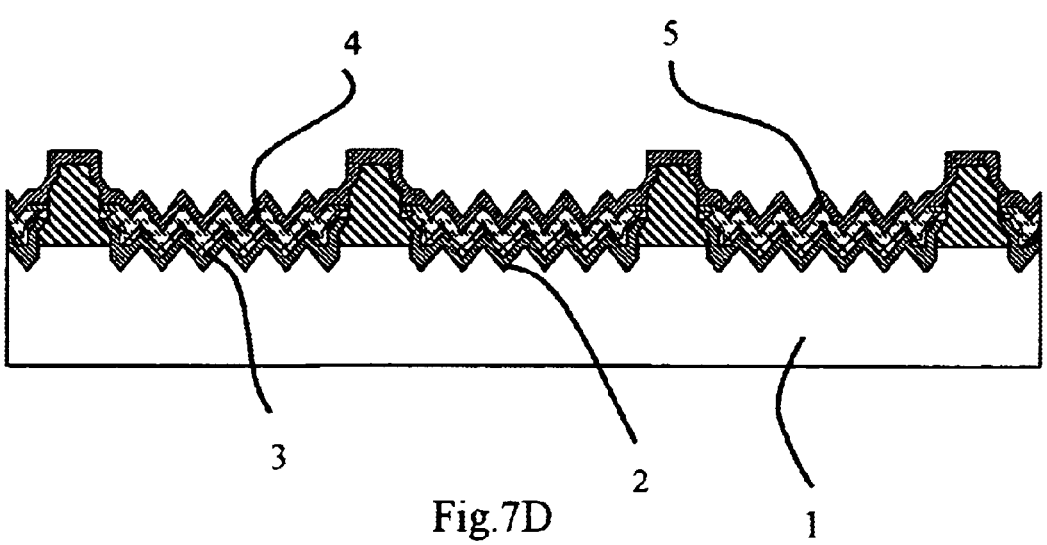

Referring to FIG. 7D, ITO with a thickness of 50 nm for forming anodes 2 is deposited on the entire surface of the substrate 1 and is patterned into stripes along the barriers 10 by known photolithography. Poly(ethylenedioxythiphene)/polystyrenesulphonic acid (PEDOT/PSS) with a thickness of 50 nm for forming hole transport layers 3 is applied onto the entire surface of the substrate 1 by spin coating. Rhodamine-containing poly(p-phenylenevinylene) (PPV) for a red EL layer, PPV for a green EL layer, and polydioctylfluorene for a blue EL layer are applied with regularity into a stripe pattern along the barriers 10 by printing, each layer having a thickness of 50 nm. For forming cathodes 5, lithium fluoride, calcium, and aluminum are continuously deposited in that order through a mask of stripes perpendicular to the barriers 10.

The brightness of the resulting EL display device is the same as 150% of that of a reference EL display device having the same structure but without irregularities under the same drive conditions.

Second Embodiment

Figure 8:
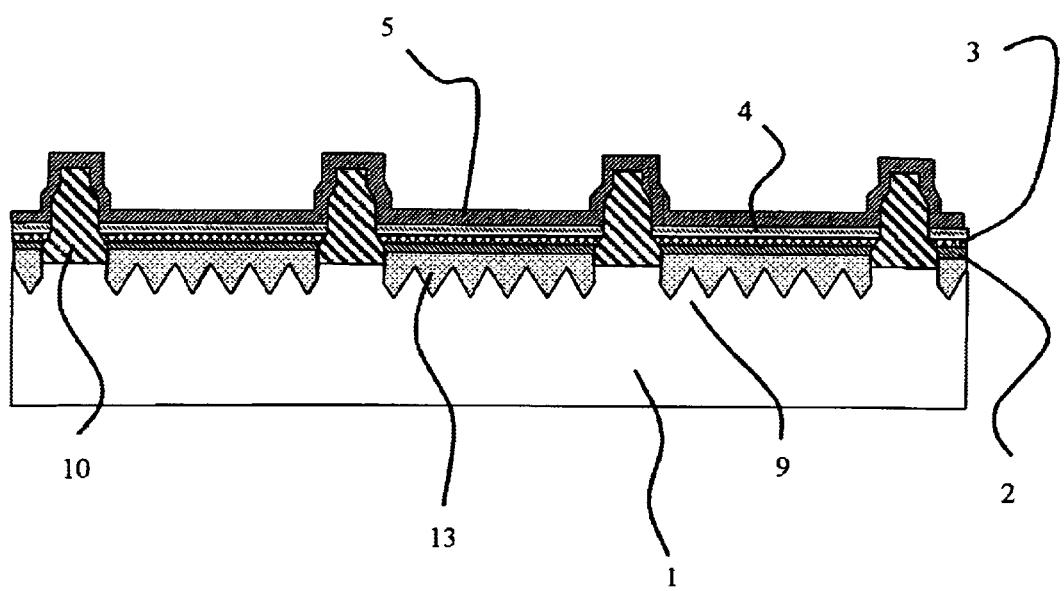
FIG. 8 is a schematic cross-sectional view of an EL display device according to a second embodiment of the present invention.

FIG. 8 is a schematic cross-sectional view of an EL display device according to a second embodiment of the present invention. In the first embodiment, irregularities 9 with sharp peaks are formed in some cases. The sharp peaks disadvantageously cause cracking and disconnection of each overlying layer. To solve such a disadvantage, planarization layers 13 are provided on the irregularities 9 in the second embodiment. The planarization layers 13 are composed of, for example, zirconium oxide. The planarization layers 13 prevent the anodes 2, the hole transport layers 3, the EL layers 4, and the cathodes 5 from cracking and disconnecting. The refractive index of the planarization layers 13 must be different from that of the substrate and is preferably larger than that of the overlying anodes 2. The surface of planarization layers 13 is not necessary to be completely flat as long as these layers prevent cracking and disconnection of the overlying layers.

The planarization layers 13 are formed as follows. After the formation of the barriers 10 and the irregularities 9 according to the first embodiment, a solution containing a fatty acid zirconium salt is applied onto the entire surface by spin coating and is baked to cure. Other materials for forming the planarization layers 13 may be hafnium oxide, titanium oxide, and zinc oxide. The planarization layers 13 composed of these materials may also be formed by applying and then baking a solution of a fatty acid salt of the corresponding metal to cure.

Figure 9:
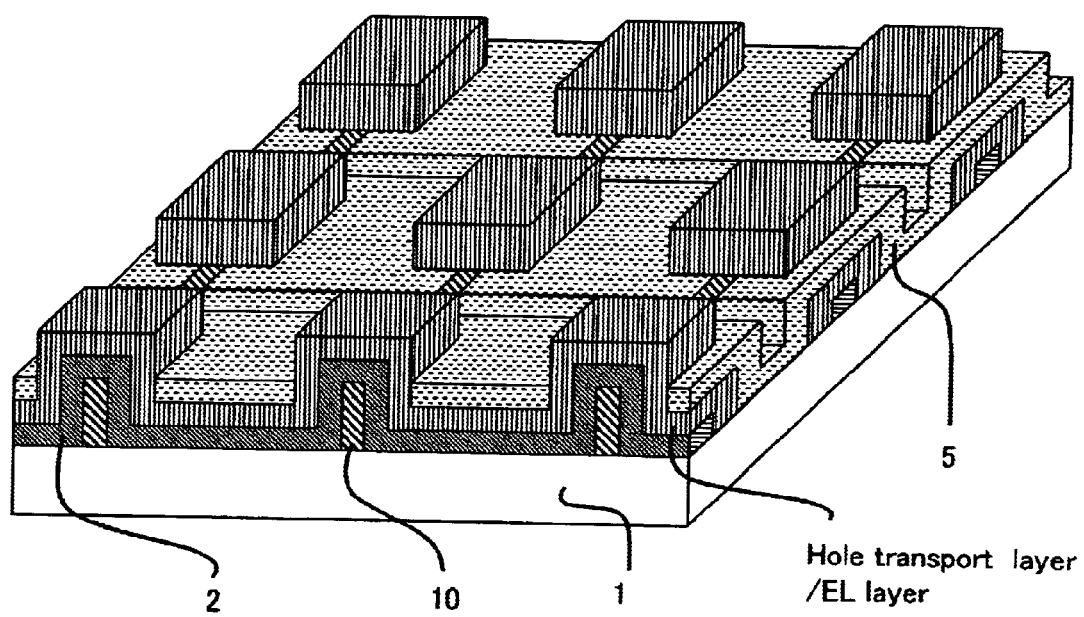
FIG. 9 is a schematic isometric cross-sectional view of a modification of the first and second embodiment according to the present invention.
Figure 10:
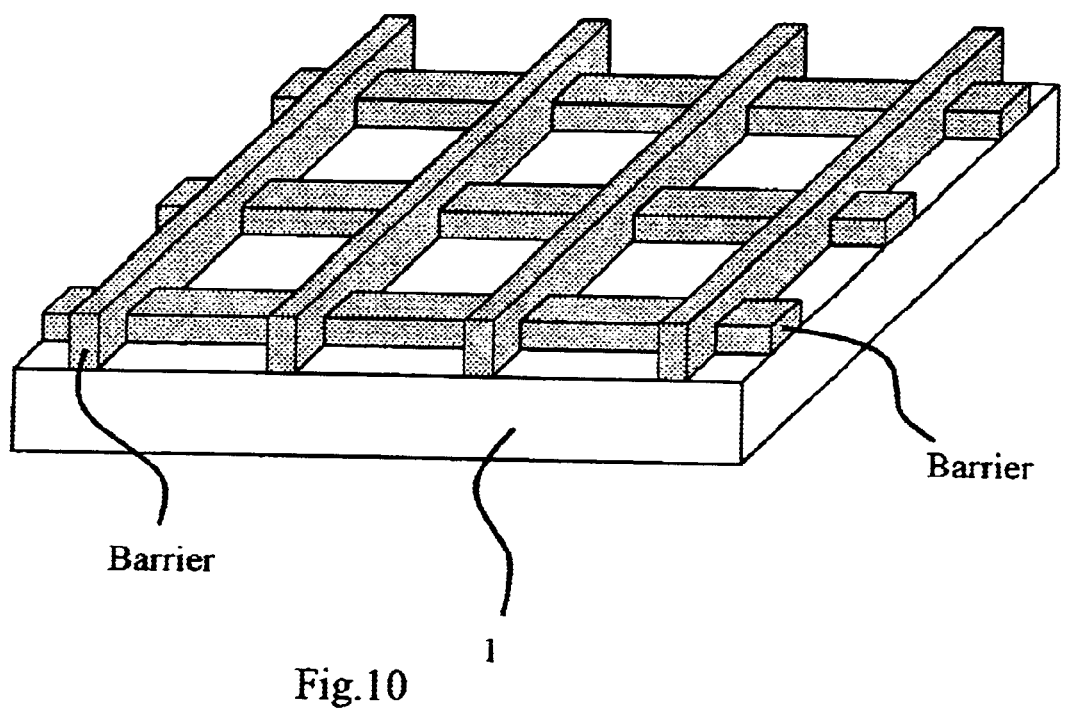
FIG. 10 is a schematic isometric cross-sectional view of another modification of the first and second embodiment according to the present invention.

FIG. 9 shows a modification of the first and second embodiment, in which striped anodes 2 are disposed perpendicularly to barriers 10. FIG. 10 shows another modification, in which perpendicular barriers 10 and horizontal barriers 10 have different heights and form a grid.

Third Embodiment

Figure 11:
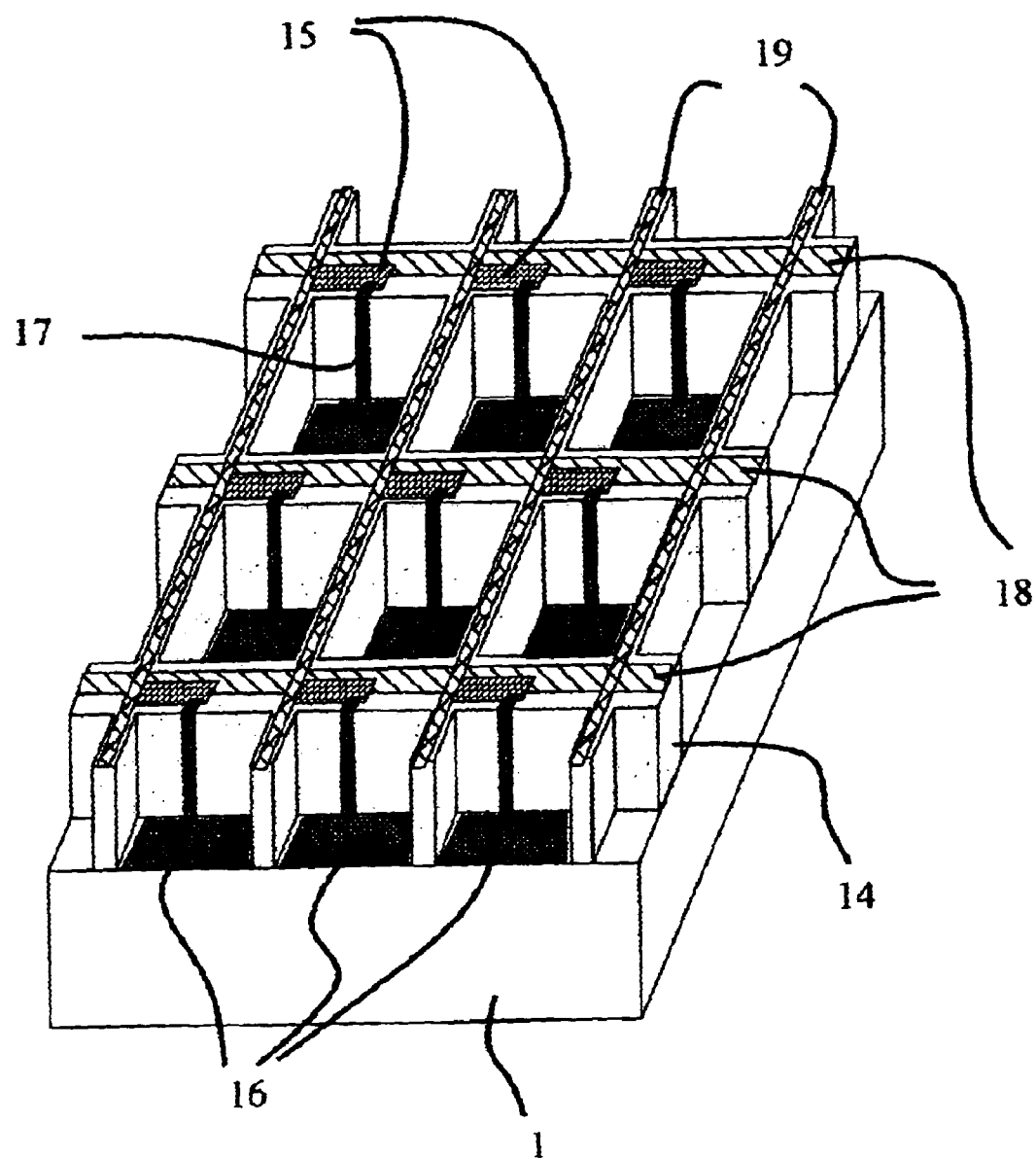
FIG. 11 is a schematic isometric cross-sectional view of an active matrix EL display device according to a third embodiment of the present invention.

FIG. 11 shows a schematic active matrix EL display device including thin film transistors (TFTs) as switching elements according to the present invention. Double-faced barriers 14 surround pixels, and TFTs 15 are formed in flat tops of the barriers 14. Transparent display electrodes 16 are connected to the TFTs 15 through connections 17. Irregularities for light scattering are formed below the display electrodes 16 whereas hole transport layers, light-emitting layers with EL layers, and common electrodes functioning as cathodes are formed on the entire display region on a substrate 1 (these are not depicted in FIG. 10, but are depicted in FIG. 11).

Figure 12:
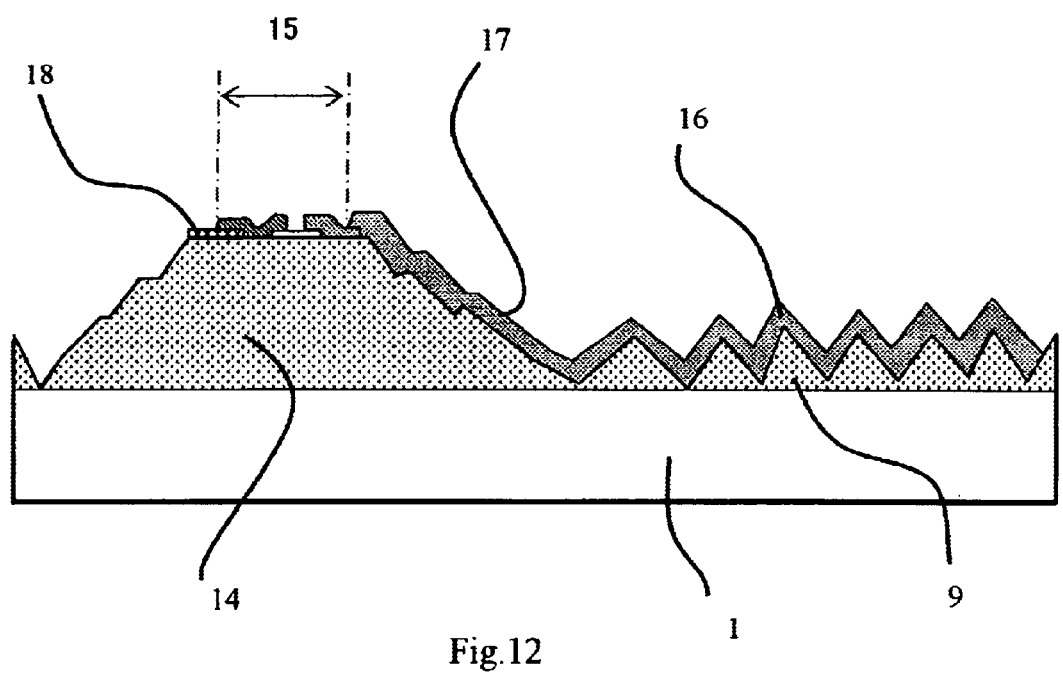
FIG. 12 is a schematic partial cross-sectional view of a substrate for the EL display device according to the third embodiment.

FIG. 12 is a partial schematic cross-sectional view of the substrate 1 for the EL display device according to the third embodiment. The side walls of each barrier 14 are tapered to prevent disconnection between the source of the TFT 15 and the connection 17 for the display electrode 16.

The TFTs 15 must be formed on a flat underlayer. Preferably, scanning bus lines that supply signals for ON/OFF operation of gates of the TFTs 15 and data bus lines that supply drive current to the display electrodes through drains/sources of the TFTs 15 are also disposed on the flat underlayer. In the present invention, the regions for forming pixels have uneven surfaces for light scattering; hence, areas for forming the TFTs 15 and the scanning and data bus lines must be planarized if these are formed on the uneven surfaces. In the present invention, however, a data bus line 18 and a scanning bus line 19 are formed on the tops of each lateral barrier and each longitudinal barrier, respectively, and a TFT 15 is formed on the top of each barrier 14. As a result, no planarization process is required.

In this embodiment, the barriers may be striped as in the former embodiments. In this instance, the TFTs and either bus lines can be disposed on the tops of the barriers, whereas the other bus lines must be disposed perpendicularly to the barriers and the regions for forming the pixels.

The present invention may also include any combination of these embodiments and modifications, for example, a combination of grid barriers and the simple matrix EL display device and a combination of an active matrix panel and the planarization layer.

Fourth Embodiment

As described in the second embodiment, irregularities with sharp peaks are formed during the formation of barriers and the irregularities by a sandblasting process. The sharp peaks may cause defects such as disconnection. In particular, the edge of each barrier is sharp. When switching elements 15 such as TFTs are formed on the barriers as shown in FIGS. 11 and 12, disconnection may occur between the display electrodes 16 and the connections 17. In order to prevent such disconnection, the planarization layers are provided in the second embodiment. Thus, steps are required for applying and curing the planarization layers. Another possible way is rounding of the sharp edge portions by etching after the formation of the barriers 14 and the irregularities 19. This way, however, requires the etching step.

This embodiment provides rounding of sharp edge portions without introducing an additional step.

FIGS. 13A to 13F are cross-sectional views of steps of forming the light-emitting display device of this embodiment. This device includes an inverted-staggered TFT of which a gate electrode is arranged in the bottommost layer at the surface of a substrate. In this embodiment, a sandblasting step is employed for forming the barriers 14 and the irregularities 9 on the way of the steps of forming the TFT 15 on the substrate, and the sharp edges of the barriers 14 and the irregularities 9 are removed during the etching step for patterning the insulating film in the structure of the switching element.

Figure 13A:
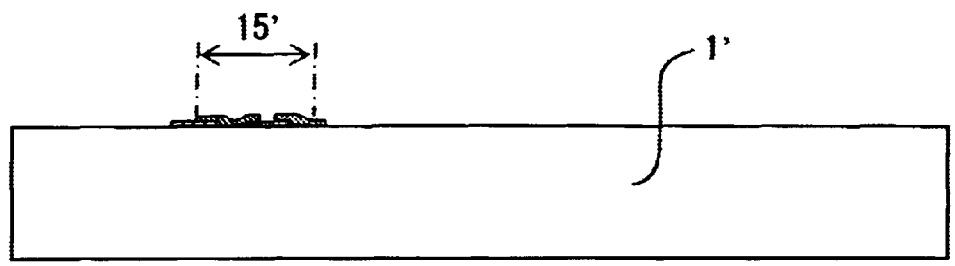
FIGS. 13A to 13F are schematic cross-sectional views showing steps of forming the light-emitting display device according to the forth embodiment.
Figure 13B:
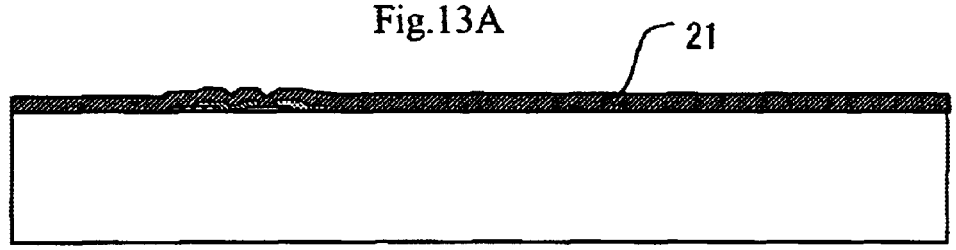
Figure 13C:
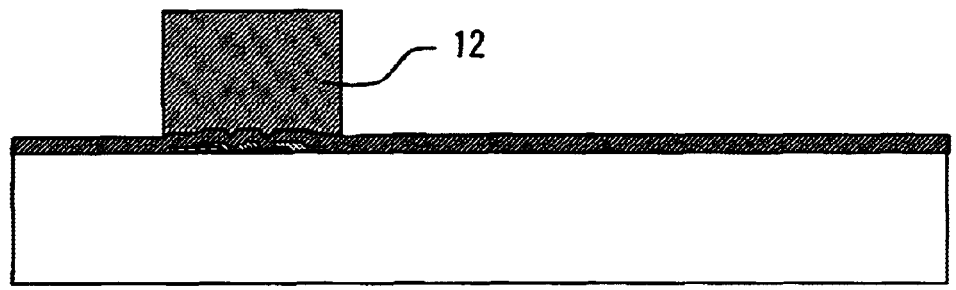
Figure 13D:
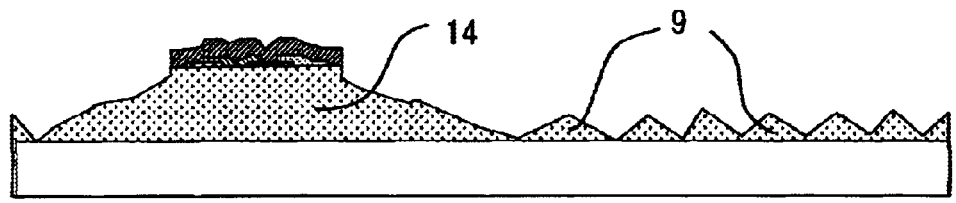
Figure 13E:
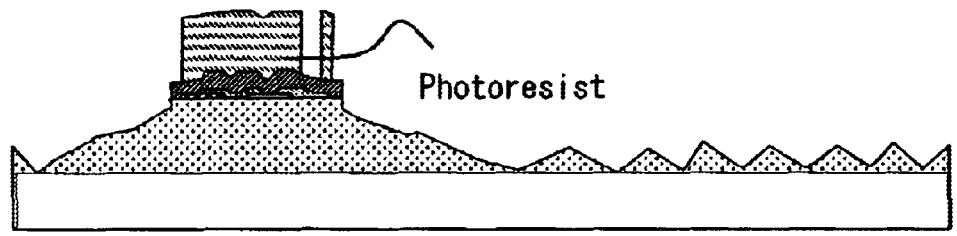
Figure 13F:
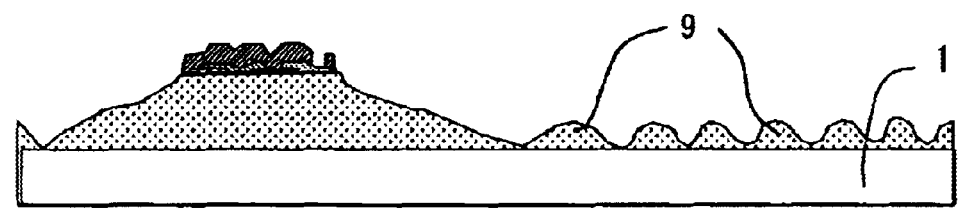

Referring to FIG. 13A, source/drain electrodes are formed on a glass substrate 1' by a general TFT forming step (the uncompleted TFT is referred to with reference numeral 15'). Referring to FIG. 13B, a protective insulating film 21 composed of, for example, silicon dioxide ($SiO_2$) is formed on the entire substrate surface by plasma enhanced CVD or the like. In general, the protective insulating film 21 has a thickness of about 200 nm. Referring to FIG. 13C, a dry film is bonded to the substrate and is selectively removed by exposure and development so that positions corresponding to the barriers are left. Referring to FIG. 13D, the barriers 14 and the irregularities 9 are formed by sandblasting and the dry film 12 is removed. The portions, not covered by the dry film, of the insulating protective film are removed during the sandblasting. The uncompleted TFT 15', which is covered by the dry film 12, is not damaged during the sandblasting. Referring to FIG. 13E, a photoresist is applied onto the entire surface of the substrate, and is selectively removed by exposure and development to form an insulating protective film. Portions not covered with the insulating protective film are etched with a buffered hydrofluoric acid etching solution. As shown in FIG. 13F, the edges of the barriers 14 and the irregularities are also etched to round the sharp edges. General steps for forming TFTs and EL devices, such as formation of connections and display electrodes, follow to form the light-emitting display device.

In this embodiment, the sandblasting step is employed after the formation of the topmost protective insulating film and before the patterning of the protective insulating film. The sharp edges of the barriers 14 and the irregularities 9 may not be sufficiently etched by one patterning step under the terms of the thickness of the protective insulating film and the film quality. In such a case, the sandblasting step may be performed several times before the patterning step of an underlying layer such as a gate-insulating layer composed of a material that can be etched together with the substrate to round the sharp edges.

As described above, this embodiment provides rounding of sharp edge portions of the barriers and the irregularities without introducing an additional step.

In this embodiment, the inverted-staggered TFT is used as the switching element. This embodiment is also applicable to components such as a staggered TFT and a thin film diode that can be etched together with the glass of the substrate during the patterning step.

The light-emitting medium is organic EL substances in the above embodiments. Inorganic thin-film EL substances and electrochemiluminescence (ECL) substances being liquid light-emitting substances are also applicable to the present invention.

What is claimed is:

1. A light-emitting display device comprising:

a substrate;

light-emitting layers constituting pixels on a surface of the substrate, light emission from the pixel being electrically controlled;

barriers delimiting at least one side of each pixel respectively, wherein, on the surface of the substrate, at least part of a region that corresponds to each pixel has irregularities for light scattering, the difference between the maximum height and the minimum height of the irregularities being at least 0.4 $\mu$m, and the barriers and the irregularities are formed directly in the substrate material.

2. The light-emitting display device according to claim 1, wherein the barriers and the irregularities are formed by sandblasting.

3. The light-emitting display device according to claim 1, wherein the side walls of each barrier are tapered from the top to the bottom.

4. The light-emitting display device according to claim 1, further comprising planarization layers between the substrate with the irregularities and light-emitting layers, the refractive index of the planarization layers differing from that of the substrate.

5. The light-emitting display device according to claim 4, further comprising electrode layers on the planarization layers, the refractive index of the planarization layers being greater than that of the electrode layers.

6. A light-emitting display device comprising:

a substrate;

light-emitting layers constituting pixels on a surface of the substrate, light emission from the pixel being electrically controlled;

switching element being provided for each pixel to control the light-emission from the light-emitting layer in the pixel;

barriers delimiting at least one side of each pixel respectively, wherein, the switching elements are placed on the tops of the barriers on the surface of the substrate, and at least part of a region that corresponds to each pixel has irregularities for light scattering, the difference between the maximum height and the minimum height of the irregularities being at least 0.4 $\mu$m.

7. The light-emitting display device according to claim 6, wherein the barriers are disposed to form a grid, each switching element is disposed near each intersection of the grid, and scanning bus lines and orthogonal data bus lines are disposed on the lateral barriers and longitudinal barriers.

8. The light-emitting display device according to claim 6, wherein the barriers and the irregularities are formed by sandblasting.

9. The light-emitting display device according to claim 6, wherein the side walls of each barrier are tapered from the top to the bottom.

10. The light-emitting display device according to claim 6, further comprising planarization layers between the substrate with the irregularities and light-emitting layers, the refractive index of the planarization layers differing from that of the substrate.

* * * * *